US007732858B2

(12) United States Patent
Kang et al.

(10) Patent No.: US 7,732,858 B2
(45) Date of Patent: Jun. 8, 2010

(54) HIGH VOLTAGE INTEGRATION CIRCUIT WITH FREEWHEELING DIODE EMBEDDED IN TRANSISTOR

(75) Inventors: Taeg-hyun Kang, Incheon Metropolitan (KR); Sung-son Yun, Seoul (KR)

(73) Assignee: Fairchild Korea Semiconductor, Ltd., Bucheon (KR)

( * ) Notice: Subject to any disclaimer, the term of this patent is extended or adjusted under 35 U.S.C. 154(b) by 48 days.

(21) Appl. No.: 11/603,671

(22) Filed: Nov. 22, 2006

(65) Prior Publication Data

US 2007/0132008 A1 Jun. 14, 2007

(30) Foreign Application Priority Data

Nov. 22, 2005 (KR) ........................ 10-2005-0111881

(51) Int. Cl.
*H01L 29/94* (2006.01)
(52) U.S. Cl. .................. 257/328; 257/500; 257/546; 257/551; 257/552
(58) Field of Classification Search ............. 257/328, 257/500, 546, 551, 552
See application file for complete search history.

(56) References Cited

U.S. PATENT DOCUMENTS

| 5,469,103 A | * | 11/1995 | Shigekane ............... 327/478 |
| 6,448,587 B1 | * | 9/2002 | Kohno et al. ............. 257/133 |
| 7,420,260 B2 | * | 9/2008 | Kwon et al. ............. 257/547 |

* cited by examiner

*Primary Examiner*—Matthew E Warren
(74) *Attorney, Agent, or Firm*—Sidley Austin LLP

(57) ABSTRACT

A high voltage integrated circuit contains a freewheeling diode embedded in a transistor. It further includes a control block controlling a high voltage transistor and a power block—including the high voltage transistor—isolated from the control block by a device isolation region. The high voltage transistor includes a semiconductor substrate of a first conductivity type, a epitaxial layer of a second conductivity type on the semiconductor substrate, a buried layer of the second conductivity type between the semiconductor substrate and the epitaxial layer, a collector region of the second conductivity type on the buried layer, a base region of the first conductivity type on the epitaxial layer, and an emitter region of the second conductivity type formed in the base region. The power block further includes a deep impurity region of the first conductivity type near the collector region to form a PN junction.

10 Claims, 13 Drawing Sheets

HIGH VOLTAGE INTEGRATION CIRCUIT WITH FREEWHEELING DIODE EMBEDDED IN TRANSISTOR

CROSS-REFERENCE TO RELATED PATENT APPLICATIONS

This application claims the benefit of Korean Patent Application No. 10-2005-0111881, filed on Nov. 22, 2005, in the Korean Intellectual Property Office, the disclosure of which is incorporated herein in its entirety by reference.

BACKGROUND

1. Field of the Invention

The present invention relates to a semiconductor integrated circuit, and more particularly, to a high voltage integrated circuit with a freewheeling diode embedded in a high voltage transistor.

2. Description of the Related Art

Figure 1A:
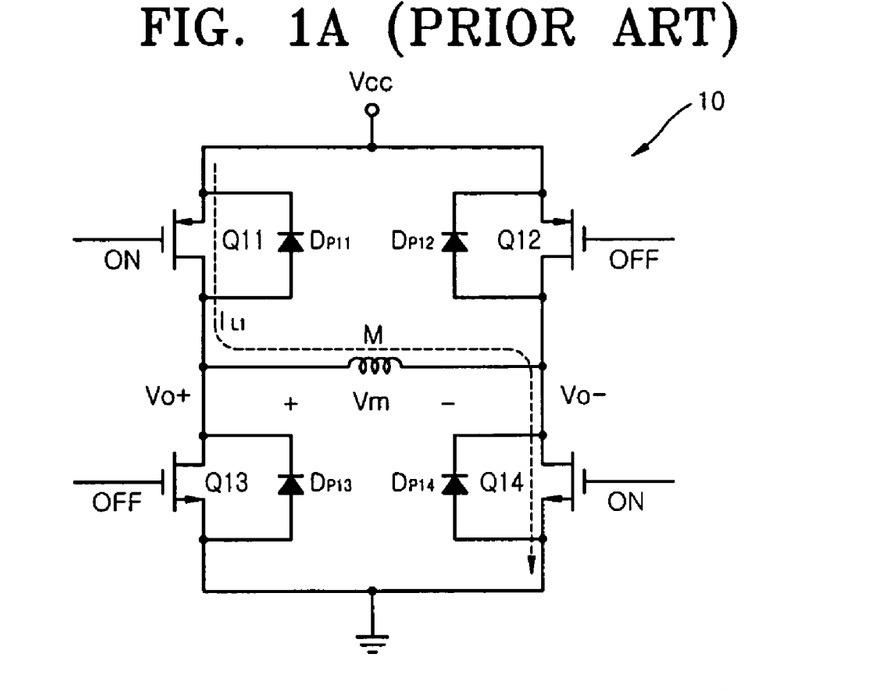
FIG. 1A is a schematic circuit diagram of a conventional high voltage integrated circuit for driving a motor in a normal operation mode.
Figure 1B:
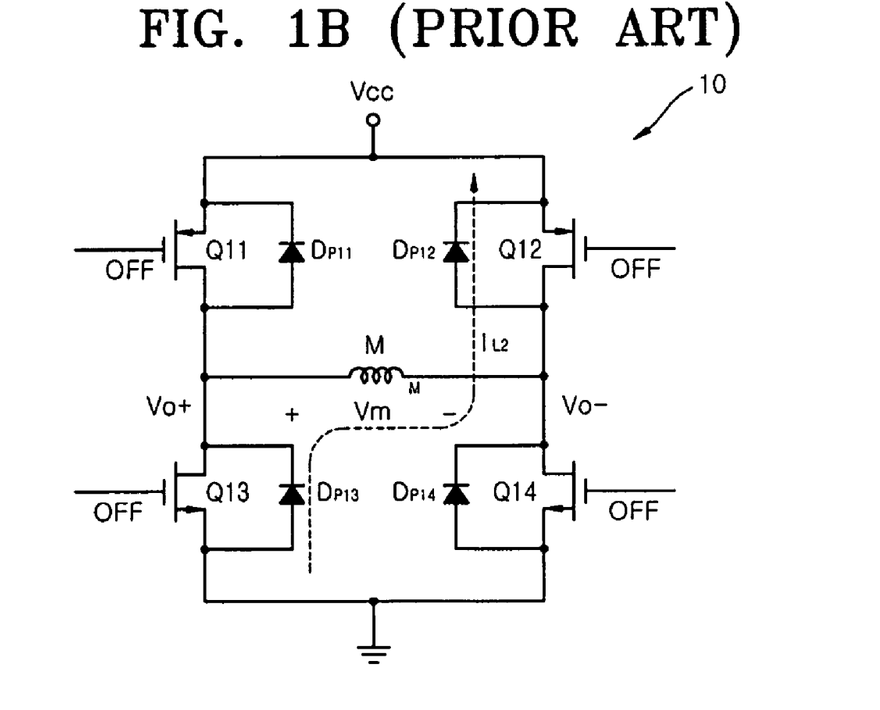
FIG. 1B is a circuit diagram of a conventional high voltage integrated circuit for driving a motor in a freewheeling operation mode.

FIGS. 1A and 1B are schematic circuit diagrams of a conventional high voltage integrated circuit 10 for driving a motor, wherein FIG. 1A is a circuit diagram of the circuit 10 in a normal operation mode and FIG. 1B is a circuit diagram of the circuit 10 in a freewheeling operation mode. The motor operates as an inductive load, wherein not only a parasitic operation but also a current sink from another block must be always taken into consideration. The high voltage integrated circuit 10 uses a PWM scheme and includes first through fourth transistors Q11, Q12, Q13 and Q14. For example, the first and fourth transistors Q11 and Q14 contribute to the clockwise rotation of a motor M, while the second and third transistors Q12 and Q13 contribute to the counterclockwise rotation of the motor M. First through fourth diodes DP11, DP12, DP13 and DP14 respectively connected in parallel to the first through fourth transistors Q11, Q12, Q13 and Q14 are parasitic diodes and operate in a freewheeling operation mode.

A first switching device pair configured to include the first and fourth transistors Q11 and Q14 and a second switching device pair configured to include the second and third transistors Q12 and Q13 are selectively turned on to alternately change the direction of a current flowing through the motor M. For example, when the first and fourth transistors Q11 and Q14 are turned on and the second and third transistors Q12 and Q13 are turned off, a current IL1 flows through the first transistor Q11, the motor M and the fourth transistor Q14, as illustrated in FIG. 1A. Accordingly, the motor M normally rotates in a clockwise direction, for example.

Thereafter, when the first and fourth transistors Q11 and Q14 are turned off, the inductive load characteristics of the motor M cause a current IL2 to flow through the second and third diodes DP12 and DP13, as illustrated in FIG. 1B. This is called a freewheeling mode. Accordingly, in the freewheeling mode, the voltage of an output node Vo+ is maintained lower than that of a ground node by about −1V. This lower voltage of the output node Vo+ causes a current sink from another block (e.g., a control block) to the output node Vo+. This current sink causes noise or signal distortion to occur, resulting in malfunction of the control block.

Figure 2A:
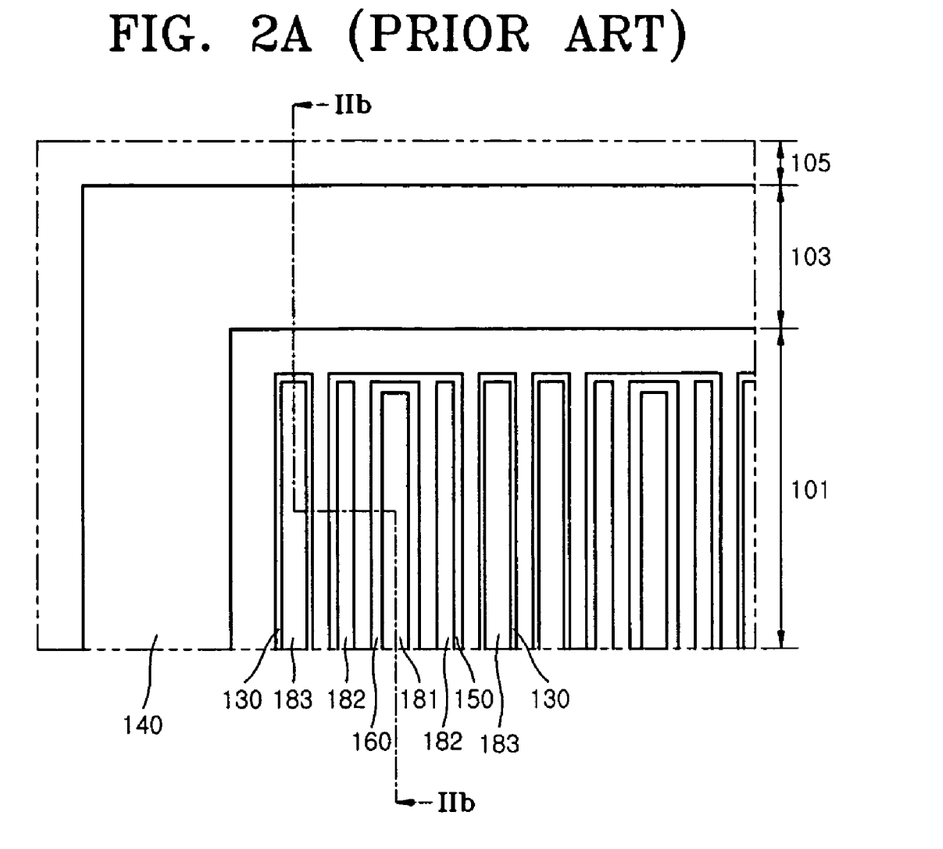
FIG. 2A is a plan view of a conventional high voltage integrated circuit for driving a motor.
Figure 2B:
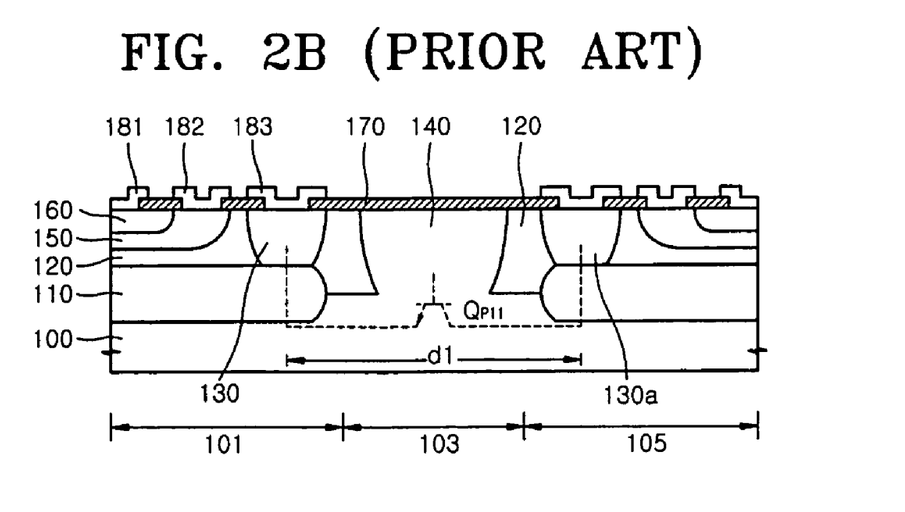
FIG. 2B is a sectional view taken along a line IIb-IIb of FIG. 2A.

FIG. 2A illustrates a plan view of a conventional high voltage integrated circuit for driving a motor, and FIG. 2B is a sectional view taken along a line IIb-IIb of FIG. 2A. FIGS. 2A and 2B particularly illustrate the third transistor Q13 and the third diode DP13 of FIG. 1A or 1B.

FIGS. 2A and 2B show a device isolation region 103 disposed between a control block 105 and a power block 101. The power block 101 is surrounded by the device isolation region 103 and is thus isolated from the control block 105. An N-type epitaxial layer 120 is formed on a semiconductor layer 100, and an N+-type buried layer 110 is formed between the semiconductor layer 100 and the N-type epitaxial layer 120. A high voltage transistor is formed in the power block 101. The high voltage transistor includes a P-type base region 150 formed in the N-type epitaxial layer 120, an N+-type emitter region 160 formed in the P-type base region 150, and a collector region 130 that is an N+-type sink region.

A parasitic NPN bipolar transistor QP11 is formed of a P-type impurity region 140 formed in the device isolation layer 103, the N+-type sink region 130 of the power block 101, and an N+-type sink region 130a formed in the control block 105. Accordingly, a current sink occurs from the control block 105 through the parasitic NPN bipolar transistor QP11. In order to prevent this current sink, a sufficient distance d1 of, for example, about 300 μm must be maintained between the control block 105 and the power block 101. This causes a device size and a substrate resistance to increase.

In order to prevent the current sink caused by the parasitic transistor QP11, a method using a guard ring formed in the device isolation region has been proposed.

Figure 3A:
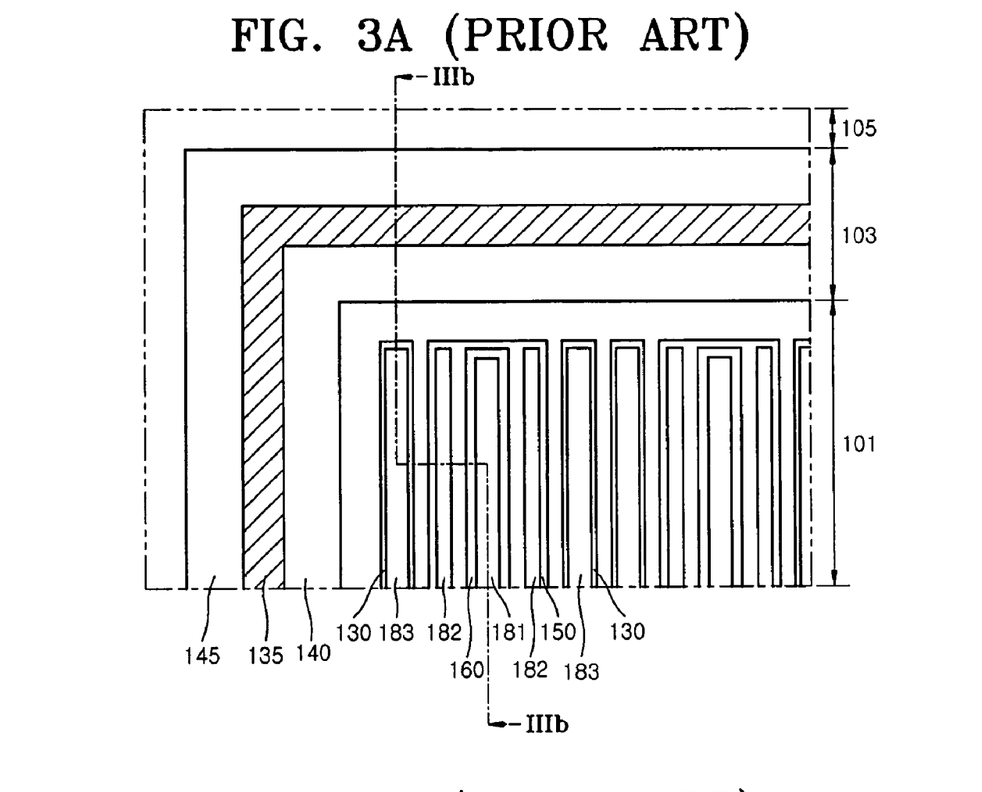
FIG. 3A is a plan view of another conventional high voltage integrated circuit for driving a motor.
Figure 3B:
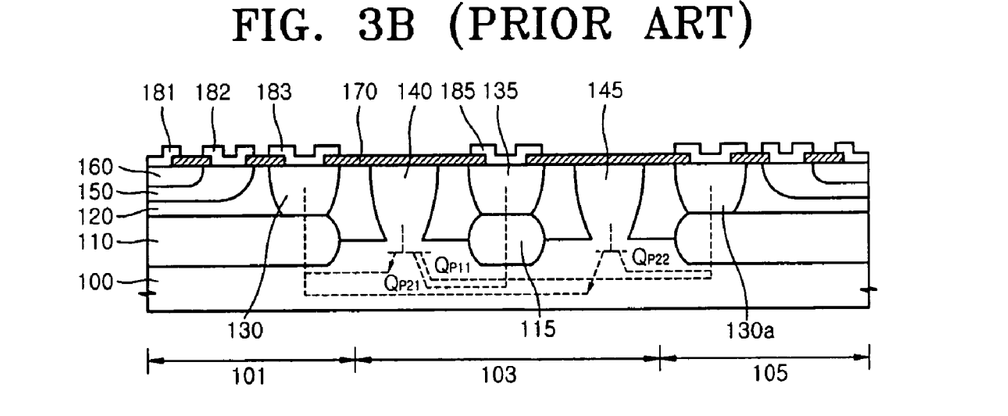
FIG. 3B is a sectional view taken along a line IIIb-IIIb of FIG. 3A.

FIG. 3A illustrates a plan view of another conventional high voltage integrated circuit having a guard ring and driving a motor, and FIG. 3B is a sectional view taken along a line IIIb-IIIb of FIG. 3A. FIGS. 3A and 3B particularly illustrate the third transistor Q13 and the third diode DP13 of FIG. 1A or 1B.

FIGS. 3A and 3B show a device isolation region 103 disposed between a power block 101 and a control block 105. The device isolation region 103 includes P-type impurity regions 140 and 145, and an N+-type guard ring 135 formed between the P-type impurity regions 140 and 145. The formation of the N+-type guard ring 135 reduces a current sink from the control block 105 to the power block 101. Parasitic diode DP13 includes N+-type sink region 130 acting as a cathode and substrate 100 acting as an anode.

However, a parasitic NPN transistor QP11 still exists due to an N+-type sink region 130a of the control block 105, the P-type impurity region 140, and an N+-type sink region 130. In addition, a parasitic NPN transistor QP22 is formed of the N+-type sink region 130a of the control block 105, the P-type impurity region 145, and the N+-type sink region 130. Also, a parasitic NPN transistor QP21 is formed of the N+-type guard ring 135 of the device isolation region 103, the P-type impurity region 145, and the N+-type sink region 130. Accordingly, a current sink still occurs from the control block 105 to the power block 101. Also, since the N+-type guard ring 135 must be spaced apart from the control block 105 by at least 300 μm so as to reduce the current sink, the width of the device isolation region 103 increases according to the formation of the N+-type guard ring 135.

In another conventional high voltage integrated circuit, a method using a double guard ring formed in the device isolation region has been proposed.

Figure 4A:
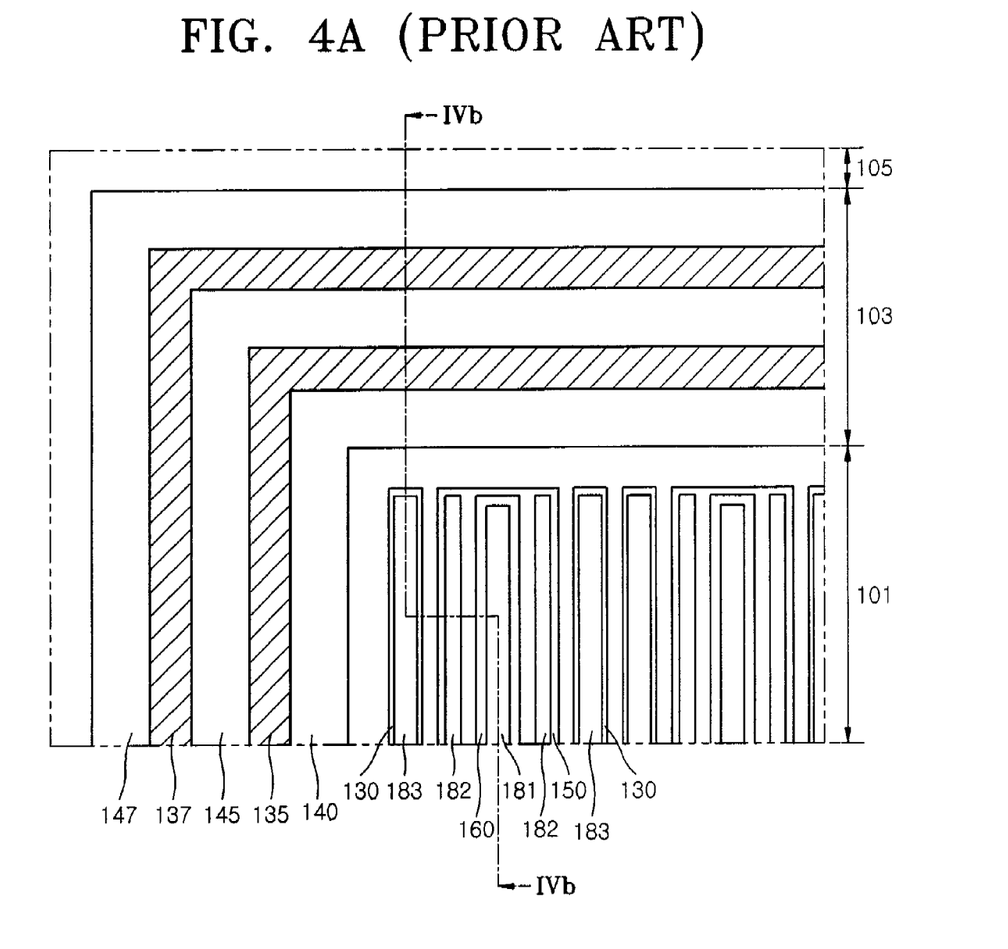
FIG. 4A is a plan view of another conventional high voltage integrated circuit for driving a motor.
Figure 4B:
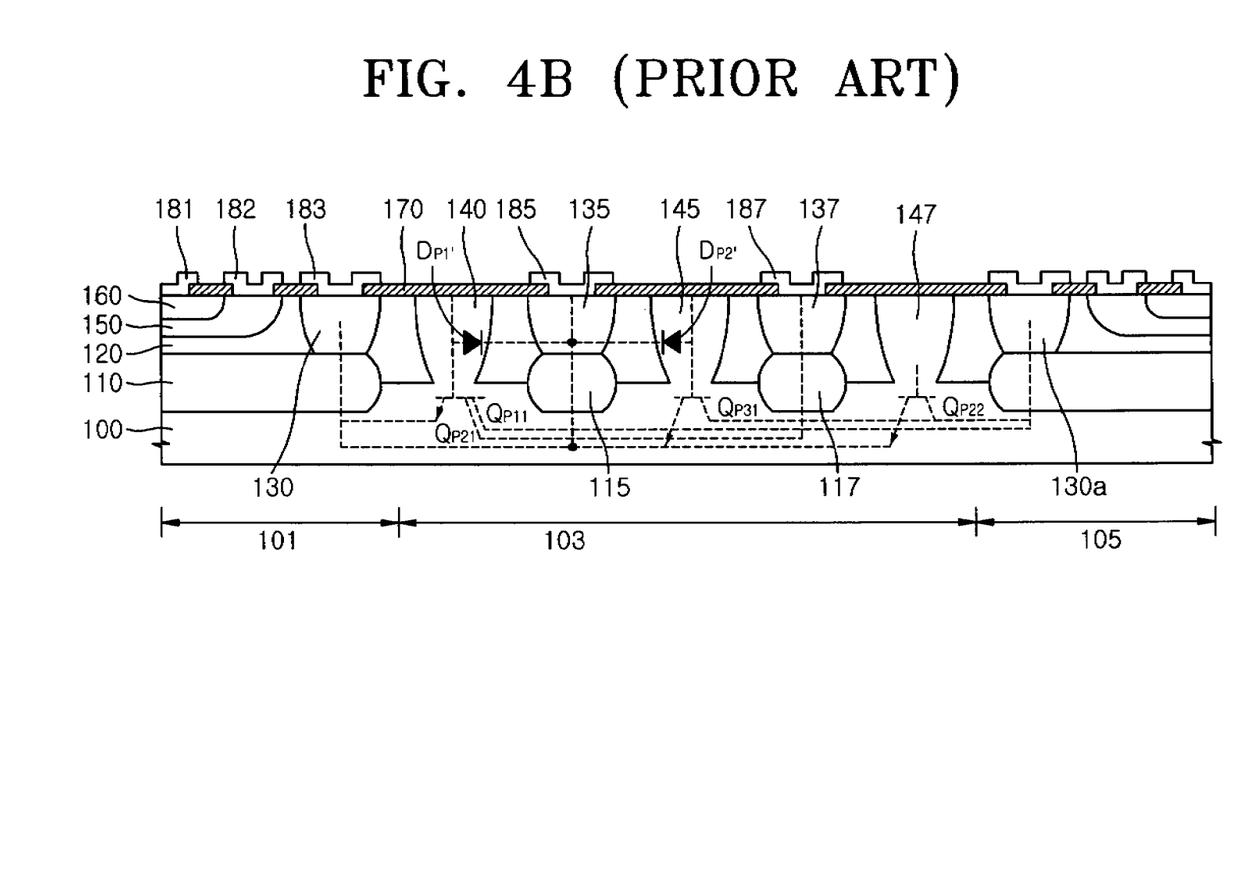
FIG. 4B is a sectional view taken along a line IVb-Ivb of FIG. 4A.

FIG. 4A illustrates a plan view of another conventional high voltage integrated circuit having the double guard ring and driving a motor, and FIG. 4B is a sectional view taken along a line IVb-IVb of FIG. 4A. FIGS. 4A and 4B particularly illustrate the third transistor Q13 and the third diode DP13 of FIG. 1A or 1B.

FIGS. 4A and 4B show N+-type guard rings 135 and 137 which are formed in a device isolation region 103 between a power block 101 and a control block 105. The formation of the N+-type guard rings 135 and 137 reduces a current sink from the control block 105 to the power block 101. Also, a PN junction is formed of P-type impurity regions 140 and 145 of the device isolation region 103 and parasitic freewheeling diodes DP1' and DP2' are formed due to the formed PN junction, which is more advantageous to the freewheeling operation of the motor.

However, also in this method, a parasitic NPN transistor QP11 still exists due to an N+-type sink region 130a of the control block 105, the P-type impurity region 140, and an N+-type sink region 130. In addition, a parasitic NPN transistor QP22 is formed of the N+-type sink region 130a of the control block 105, a P-type impurity region 147 of the device isolation region 103, and the N+-type sink region 130. Also, a parasitic NPN transistor QP21 is formed of the N+-type guard ring 137 of the device isolation region 103, the P-type impurity region 140, and the N+-type sink region 130. Also, a parasitic NPN transistor QP31 is formed of the N+-type sink region 130a of the control block 105, the P-type impurity region 145, and the N+-type sink region 130. Accordingly, a current sink still occurs from the control block 105 to the power block 101. Also, the width of the device isolation region 103 further increases according to the formation of the N+-type guard rings 135 and 137 constituting the double guard ring.

SUMMARY

Briefly and generally, embodiments of the invention include a high voltage integrated circuit whose freewheeling diode is embedded in a high voltage transistor in order to reduce a chip size.

Embodiments can also include a high voltage integrated circuit whose malfunction can be prevented by minimizing a current sink in a freewheeling operation mode.

Some high voltage integrated circuits include: a control block controlling a high voltage transistor and a power block configured to be isolated from the control block by a device isolation region. The power block includes: the high voltage transistor; a first freewheeling diode connected in parallel to the high voltage transistor; and a second freewheeling diode connected in parallel to the high voltage transistor and the first freewheeling diode, wherein the second freewheeling diode prevents a current sink from the control block to the power block when the high voltage transistor is turned off.

The high voltage transistor may be an NPN or PNP bipolar transistor. The high voltage transistor may be an N-type or P-type MOS transistor or an N-type or P-type DMOS transistor. A guard ring may be arranged in the device isolation region to surround the power block and thus isolate the power block from the control block.

Some high voltage integrated circuits include: a first transistor pair driving a motor in a first direction; a second transistor pair driving the motor in a second direction; first freewheeling diodes connected in parallel to the respective transistors of the first and second transistor pairs; and second freewheeling diodes connected in parallel to the first freewheeling diodes, respectively, wherein the second freewheeling diode operates as a current sink source when the motor stops.

Some high voltage integrated circuit include: a control block controlling a high voltage transistor and a power block configured to be isolated from the control block by a device isolation region and to include the high voltage transistor formed therein. The high voltage transistor includes: a semiconductor substrate of a first conductivity type; a epitaxial layer of a second conductivity type formed on the semiconductor substrate; a buried layer of the second conductivity type formed between the semiconductor substrate and the epitaxial layer; a collector region of the second conductivity type formed on the buried layer in the epitaxial layer; a base region of the first conductivity type formed in the epitaxial layer; and an emitter region of the second conductivity type formed in the base region, wherein the power block further includes a deep impurity region of the first conductivity type disposed near to the collector region on the buried layer to form a PN junction with the collector region.

The deep impurity region may have a double junction structure of a shallow junction region and a deep junction region, the shallow junction region having essentially the same impurity concentration and junction depth as the base region, the deep junction region having a lower concentration and a greater junction depth than the base region. The deep impurity region may have a single junction structure having a greater junction depth than the base region.

Some high voltage integrated circuit include: a control block and a power block, isolated from the control block by a device isolation region and to include a high voltage transistor formed therein. The high voltage transistor includes: a semiconductor substrate; a well of a first conductivity type formed in the semiconductor substrate; source and drain regions of a second conductivity type formed in the well; and a gate formed on the semiconductor substrate between the source and drain regions, wherein the power block further includes a deep impurity region of the first conductivity type disposed near to one of the source and drain regions in the well to form a PN junction with the one of the source and drain regions.

Some high voltage integrated circuit include: a control block controlling a high voltage transistor; and a power block, isolated from the control block by a device isolation region and to include the high voltage transistor formed therein. The high voltage transistor includes: a semiconductor substrate of a first conductivity type; a well of a second conductivity type formed in the semiconductor substrate; source and drain regions of the second conductivity type formed in the well; a body region of the first conductivity type surrounding one of the source and drain regions; and a gate formed on the semiconductor substrate between the source and drain regions, wherein the power block further includes a deep impurity region of the first conductivity type disposed near to the other one of the source and drain regions in the well to form a PN junction with the other one of the source and drain regions.

DETAILED DESCRIPTION

Several exemplary embodiments of the present invention will now be described more fully with reference to the accompanying drawings. The invention may, however, be embodied in many different forms and should not be construed as being limited to the embodiments set forth herein. In the drawings, the thicknesses of layers and regions are exaggerated for clarity. Like reference numerals in the drawings denote like elements, and thus their description will be omitted.

Figure 5A:
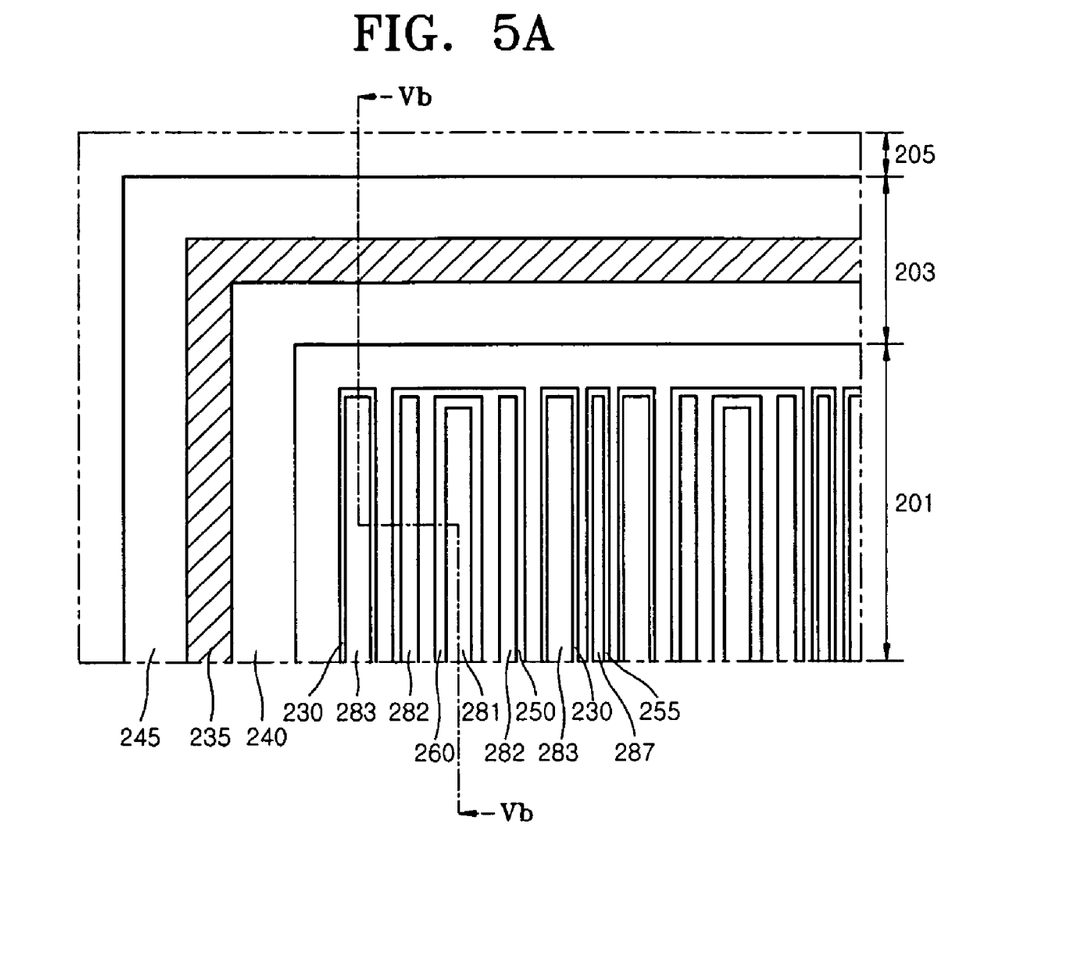
FIG. 5A is a plan view of a high voltage integrated circuit according to an embodiment.
Figure 5B:
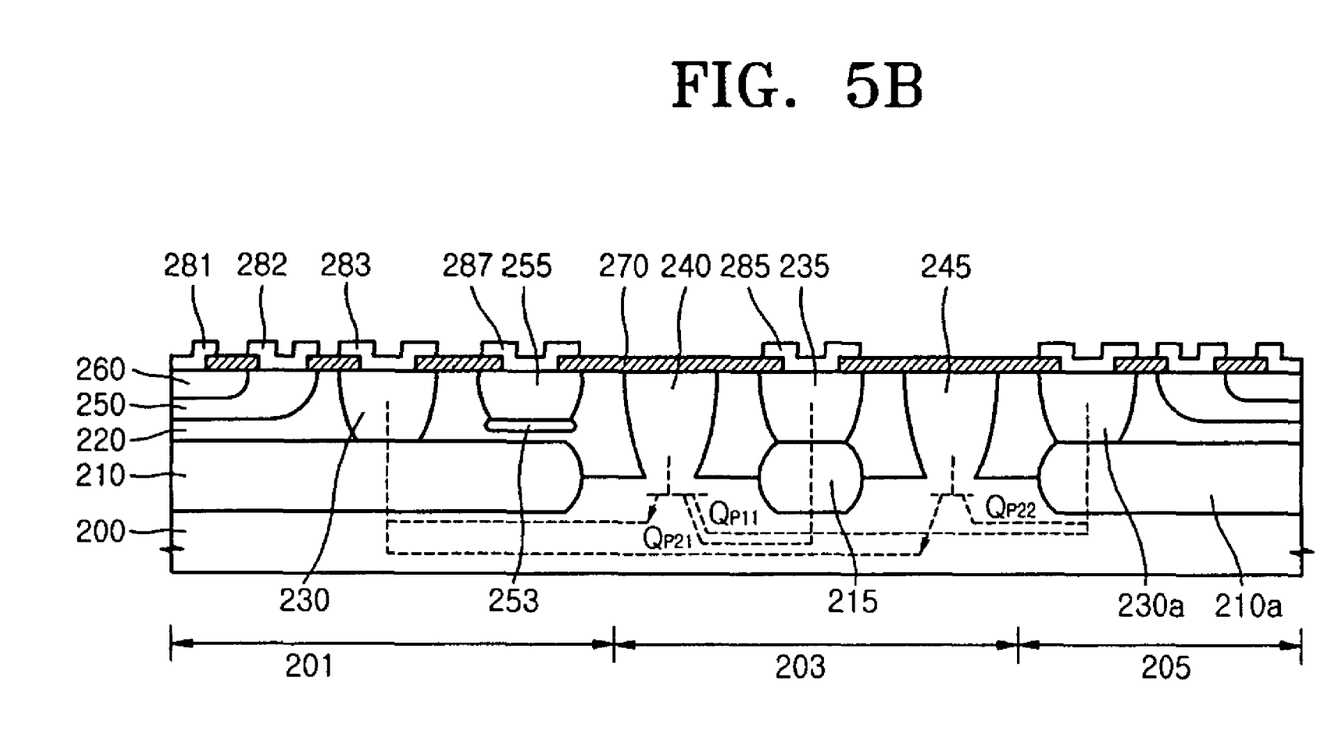
FIG. 5B is a sectional view taken along a line Vb-Vb of FIG. 5A.
Figure 5C:
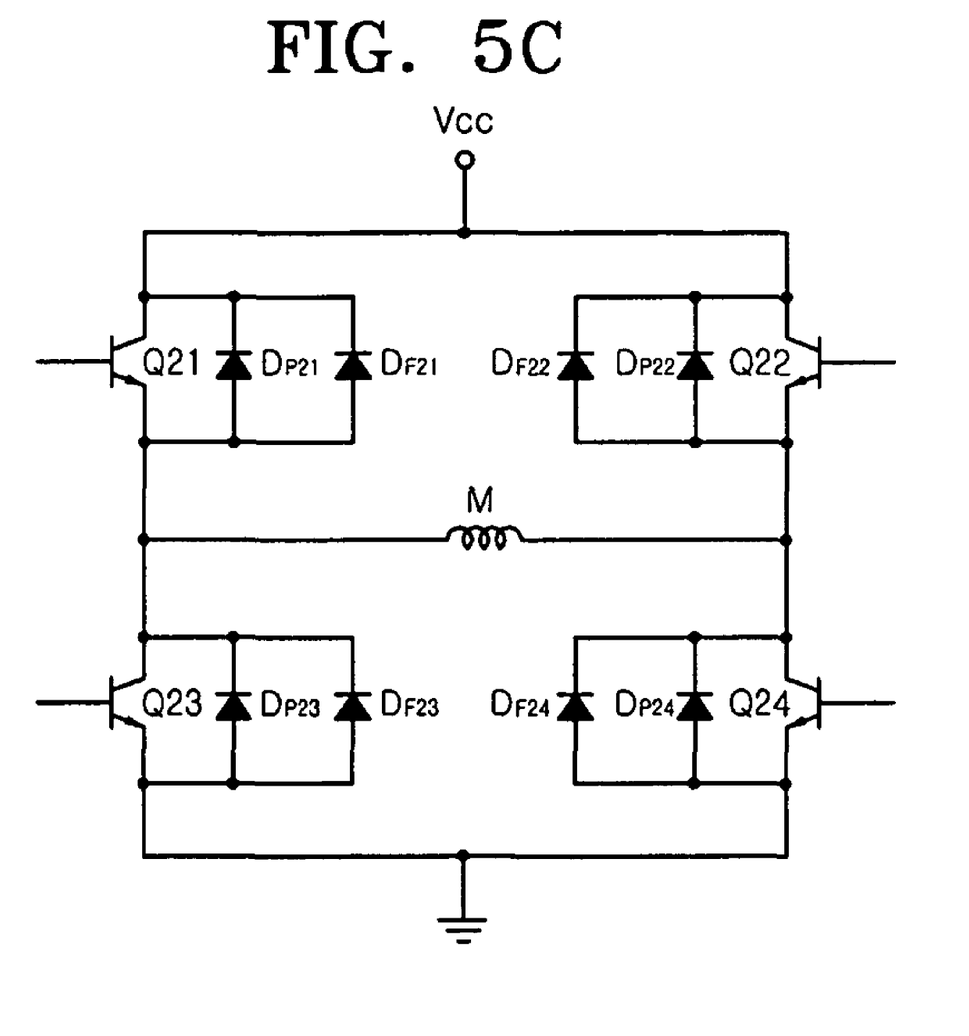
FIG. 5C is an equivalent circuit diagram of the high voltage integrated circuit in FIG. 5A.

FIG. 5A illustrates a plan view of a high voltage integrated circuit according to some embodiment. FIG. 5B is a sectional view taken along a line Vb-Vb of FIG. 5A. FIG. 5C is an equivalent circuit diagram of the high voltage integrated circuit of FIG. 5A that is applied to a motor driver circuit. In this embodiment, high voltage NPN transistors Q21, Q22, Q23 and Q24 are used for driving a motor M. FIGS. 5A and 5B particularly illustrate the transistor Q23 in FIG. 5C. In FIG. 5A, contacts between an emitter region 260 and an emitter wire 281, between a base region 250 and a base wire 282, between a collector region 230 and a collector wire 283, between a P-type body region 253 and a body wire 287, and between a guard ring 235 and a guard ring wire 285 are omitted for conciseness.

FIGS. 5A-C illustrate that a power block 201 is surrounded by a device isolation region 203 and is thus isolated from a control block 205. The power block 201 includes the high voltage transistor Q23 and a freewheeling diode DF23 embedded in the high voltage transistor Q23. An N-type epitaxial layer 220 is formed on a P-type semiconductor substrate 200. High-concentration impurities are ion-implanted into the P-type semiconductor substrate 200 to form an N+-type buried layer 210 between the N-type epitaxial layer 220 and the P-type semiconductor substrate 200 of the power block 201. At this time, N+-type buried layers 215 and 210a are simultaneously formed in the device isolation region 203 and the control block 205, respectively.

In the power block 201, an N+-type first impurity region 230 is formed on the N+-type buried layer 210, a P-type first impurity region 250 is formed in the N-type epitaxial layer 220, and an N+-type second impurity region 260 is formed in the P-type first impurity region 250. A P-type body region 253 is formed above the N+-type buried layer 210, and a P-type second impurity region 255 is formed on the P-type body region 253. The P-type second impurity region 255 is formed simultaneously with the P-type first impurity region 250 and has essentially the same impurity concentration as the P-type first impurity region 250. The P-type body region 253 is formed before the formation of the first and second P-type impurity regions 250 and 255. The P-type body region 253 has a greater junction depth and a lower impurity concentration than the first and second P-type impurity regions 250 and 255.

The N+-type first impurity region 230, the P-type first impurity region 250 and the N+-type second impurity region 260 form collector, base and emitter regions of the NPN transistor Q23, respectively. A PN junction is formed of the N+-type first impurity region 230 and the P-type semiconductor 200 to form a parasitic diode DP23. The anode region of the parasitic diode DP23 also includes the N+-type buried layer 210 together with the N+-type first impurity region 230. The second P-type impurity region 255 and the P-Type body region 253 form an anode, and the N+-type first impurity region 230 forms a cathode, thereby forming a freewheeling diode DF23. Since the N+-type first impurity region 230 is shared with the collector region of the NPN transistor Q23 and the cathode of the freewheeling diode DF23, the collector of the transistor Q23 and the cathode of the freewheeling diode DF23 are commonly connected to the output node of the motor M.

In the device isolation region 203, an N+-type guard ring 235 is formed on the N+-type buried layer 215 to surround the power block 201. The N+-type guard ring 235 is formed simultaneously with the N+-type first impurity region 230 (i.e., the collector region of the transistor Q23). P-type impurity regions 240 and 245 are formed on both sides of the N+-type guard ring 235 to isolate the power block 201 from the control block 205. An isolation layer 270 with contacts for exposing the impurity regions 250, 260, 230, 255 and 235 is formed on the substrate 200, and the impurity regions 250, 260, 230, 255 and 235 are electrically connected through the above contacts to the corresponding wires 282, 281, 283, 287 and 285, respectively.

In this embodiment, the parasitic diode DP23 is a freewheeling diode that is parasitically formed with the formation of the NPN transistor Q23, and the freewheeling diode DF23 is a current sink type freewheeling diode that is formed separately from the parasitic diode DP23 during the formation of the NPN transistor Q23. Alternatively, not the parasitic diode DP23 but the freewheeling diode DF23 may be formed simultaneously with the transistor Q23. In this case, the freewheeling diode DF23 functioning as a current sink source may be formed to be larger than the parasitic diode DP23 involved in the freewheeling operation of the motor M. This aims at facilitating the current sink to the output node in the freewheeling operation mode.

Like the conventional art, a parasitic NPN transistor QP22 is formed of an N+-type impurity region 230a of the control block 205, the P-type impurity region 245 of the device isolation layer 203, and the N+-type first impurity region 230 (i.e., the emitter region of the NPN transistor Q23). A parasitic NPN transistor QP11 is formed of the N+-type impurity region 230a of the control block 205, the P-type impurity region 240 of the device isolation region 203, and the N+-type first impurity region 230. A parasitic NPN transistor QP21 is formed of the guard ring 235, the P-type impurity region 240, and the N+-type first impurity region 230.

In the normal operation mode, when the transistors Q21 and Q24 for driving the motor M are turned on and the transistors Q22 and Q23 are turned off, the motor M normally rotates in a clockwise direction, for example. Thereafter, when the transistors Q21 and Q24 are turned off, the parasitic diodes DP22 and DP23 are turned on to operate in a freewheeling operation mode and the output node of the motor M is maintained at a low voltage with respect to a ground voltage. At this time, since the freewheeling diodes DF22 and DF23 are turned on, a current sink occurs from the freewheeling diodes DF22 and DF23.

Accordingly, although the parasitic NPN transistors QP11, QP21 and QP22 are formed as in the conventional art, because the freewheeling diode DF23 is embedded in the high voltage transistor Q23 of the power block 201 and operates as a current sink source, a current sink occurs only in the power block 201 in the freewheeling operation mode. Therefore, a current sink from another block (e.g., the control block 205) or parasitic operations of the parasitic NPN transistors QP11, QP21 and QP22 can be prevented or minimized. Also, since a current sink from the control block 205 is prevented by the formation of the freewheeling diode DF23, a distance between the control block 205 and the guard ring 235 can be reduced. The distance between the control block 205 and the guard ring 235 may be maintained at about 100 μm.

It has been described that the anode of the freewheeling diode DF23 has a double junction structure of the second P-type impurity regions 255 and the P-type body region 253. However, the anode of the freewheeling diode DF23 may be formed of a single junction structure of the P-type body region 253. In this case, the P-type body region 253 has a greater junction depth than the base region 250 as illustrated in FIG. 5B. The junction depth or impurity concentration of the P-type body region 253 is determined by the junction depth or impurity concentration of the base region 250 or the thickness of the epitaxial layer of the diode DF23 are optimized. The P-type body region 253 may have an impurity concentration of $1 \times 10^{16}$ to $1 \times 10^{18}$ cm$^{-3}$. The P-type body region 253 is formed in a stripe pattern along the high voltage transistor Q23.

Figure 6A:
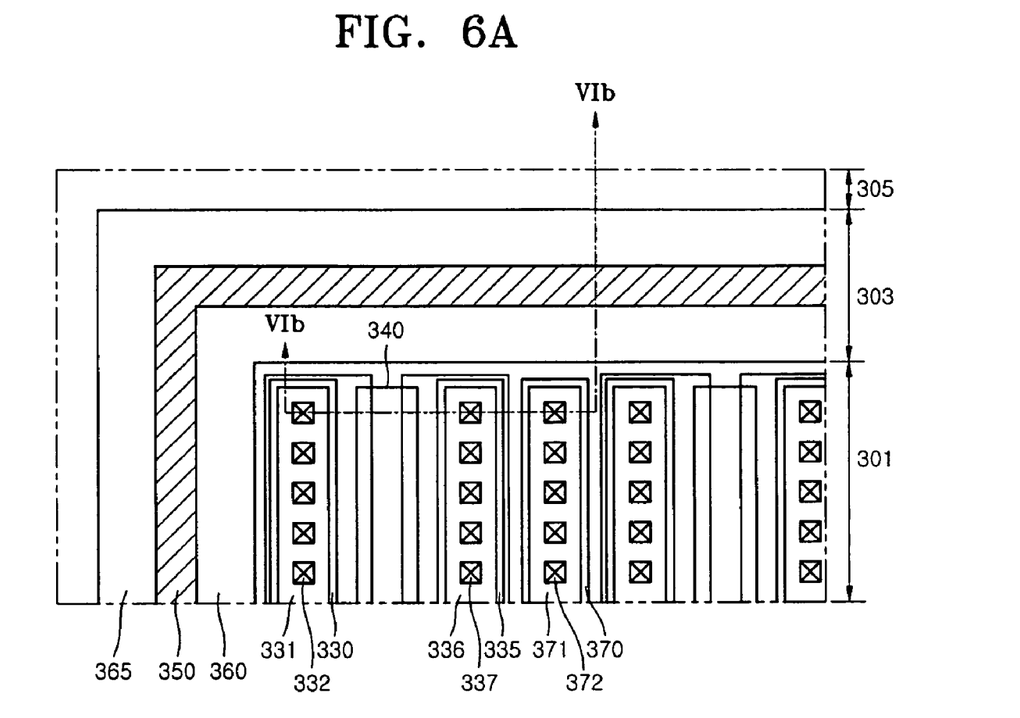
FIG. 6A is a plan view of a high voltage integrated circuit according to an embodiment.
Figure 6B:
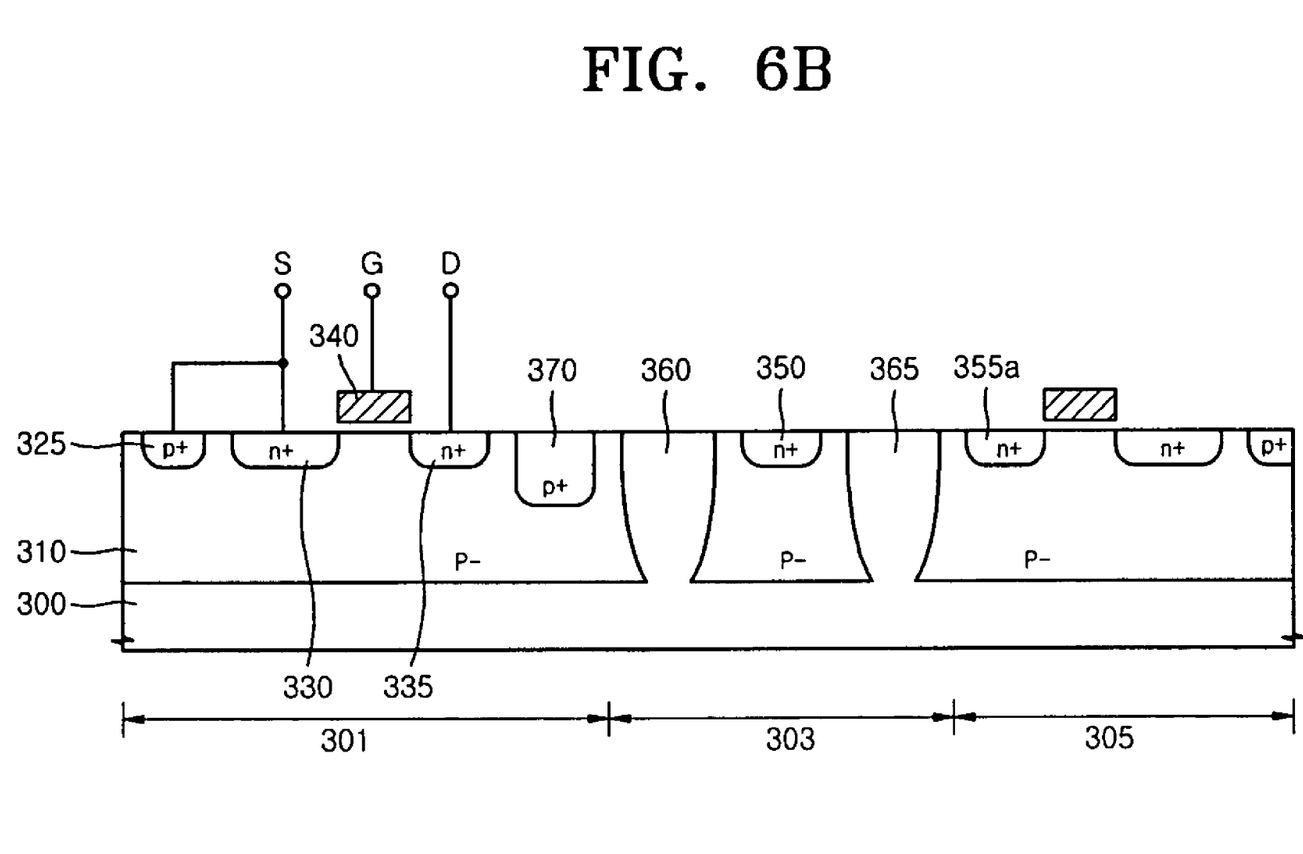
FIG. 6B is a sectional view taken along a line VIb-VIb of FIG. 6A.
Figure 6C:
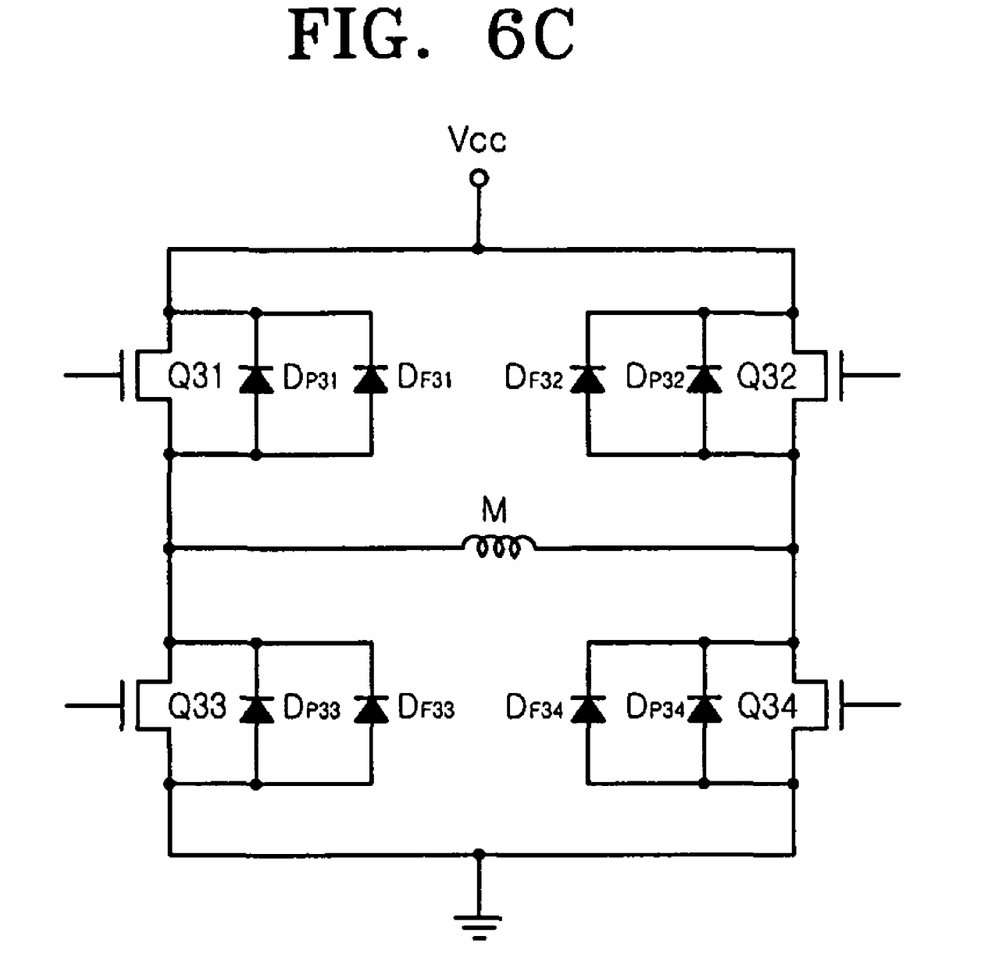
FIG. 6C is an equivalent circuit diagram of the high voltage integrated circuit in FIG. 6A.

FIG. 6A illustrates a plan view of a high voltage integrated circuit according to some embodiments, and FIG. 6B is a sectional view taken along a line VIb-VIb of FIG. 6A. FIG. 6C is an equivalent circuit diagram of the high voltage integrated circuit in FIG. 6A and FIG. 6B that is applied to a motor driver circuit. In this embodiment, NMOS transistors are used as transistors for driving a motor M. FIGS. 6A and 6B particularly illustrate a transistor Q33 and a freewheeling diode DF33 of FIG. 6C. In FIG. 6B, a source wire 331 and a drain wire 336 electrically connected respectively to an N+-type source region 330 and an N+-type drain region 335, contacts 332 and 337 electrically connecting the N+-type source and drain regions 330 and 335 to the source and drain wires 331 and 336, a wire 371 electrically connected to a P+-type deep impurity region 370, and a contact 372 electrically connecting the P+-type deep impurity region 370 to the wire 371 are omitted for conciseness.

FIGS. 6A and 6B show a power block 301 surrounded by a device isolation region 303 and is thus isolated from a control block 305. The power block 301 includes a high voltage transistor Q33 and a freewheeling diode DF33 embedded in the high voltage transistor Q33. A P--type well 310 is formed on a P-type semiconductor substrate 300, and the N+-type source region 330 and the N+-type drain region 335 are formed in the P--type well 310. A gate insulation layer (not illustrated) is formed on the substrate 300 between the N+-type source region 330 and the N+-type drain region 335, and a gate (G) 340 is formed on the gate insulation layer. The N+-type source region 330 and a P+-type junction region 325 are commonly connected through the contact 332 to the source wire (S) 331. The N+-type drain region 335 is electrically connected through the contact 337 to the drain wire (D) 336.

In the power block 301, the P+-type deep impurity region 370 is formed in the P--type well 310 neighboring the N+-type drain region 335. The P+-type deep impurity region 370 has a greater junction depth than the N+-type source and drain regions 330 and 335, and in particular, the N+-type drain region 335. The P+-type deep impurity region 370 forms a PN junction with the N+-type drain region 335 to form the freewheeling diode DF33. The P+-type deep impurity region 370 and the N+-type drain region 335 operate as an anode and a cathode, respectively. The N+-type drain region 335 forms a PN junction with the P-type semiconductor substrate 300 to form a parasitic freewheeling diode DP33. The P+-type deep impurity region 370 is electrically connected through the contact 372 to the wire 371.

In the device isolation region 303, an N+-type guard ring 350 is formed in the P--type well 310 to surround the power block 301. The N+-type guard ring 350 is formed simultaneously with the N+-type source and drain regions 330 and 335 of the transistor Q33. P-type impurity regions 360 and 365 are formed on both sides of the N+-type guard ring 350 to isolate the power block 301 from the control block 305.

In this embodiment, the parasitic diode DP33 is a freewheeling diode that is parasitically formed with the formation of the NMOS transistor Q33, and the freewheeling diode DF33 is a current sink type freewheeling diode that is formed separately from the parasitic diode DP33 during the formation of the NMOS transistor Q33. Alternatively, not the parasitic diode DP33 but the freewheeling diode DP33 may be formed simultaneously with the NMOS transistor Q33. In this case, in order to facilitate a current sink to the output node in a freewheeling operation mode, the freewheeling diode DF33 functioning as a current sink source may be formed to be larger than the parasitic diode DP33.

Like the conventional art, a parasitic NPN transistor is formed of an N+-type impurity region 335a of the control block 305, the P-type impurity region 365 of the device isolation layer 303, and the N+-type drain region 335 of the NMOS transistor Q33. Another parasitic NPN transistor is formed of the N+-type impurity region 335a of the control block 305, the P-type impurity region 360 of the device isolation region 303, and the N+-type drain region 335 of the NMOS transistor Q33. Another parasitic NPN transistor is formed of the guard ring 350, the P-type impurity region 360, and the N+-type drain region 335 of the NMOS transistor Q33.

In the normal operation mode, when the transistors Q31 and Q34 for driving the motor M are turned on and the transistors Q32 and Q33 are turned off, the motor M normally rotates in a clockwise direction, for example. Thereafter, when the transistors Q31 and Q34 are turned off, the parasitic diodes DP32 and DP33 are turned on to operate in a freewheeling operation mode and the output node of the motor M is maintained at a low voltage with respect to a ground voltage. At this time, since the freewheeling diodes DF32 and DF33 are turned on, a current sink occurs from the freewheeling diodes DF32 and DF33.

Accordingly, although the parasitic NPN transistors are formed as in the conventional art, because the freewheeling diode DF33 is embedded in the high voltage transistor Q33 of the power block 301 and operates as a current sink source, a current sink occurs only in the power block 301 in the freewheeling operation mode. Therefore, a current sink from another block (e.g., the control block 305) or parasitic operations of the parasitic NPN transistors can be prevented or minimized. Also, since a current sink from the control block 305 is prevented by the formation of the freewheeling diode DF33, a distance between the control block 305 and the guard ring 350 can be reduced. The distance between the control block 305 and the guard ring 350 may be maintained at about 100 μm.

It has been described that the anode of the freewheeling diode DF33 has a single junction structure of the P+-type deep impurity region 370. However, the anode of the freewheeling diode DF33 may have a double junction structure by forming a P+-type impurity region on the P+-type deep impurity region 370 similar to the embodiment illustrated in FIGS. 5A through 5C. In this case, the junction depth or impurity concentration of the P-type deep impurity region is determined by the junction depth of the N+-type drain region 335 or the junction depth or impurity concentration of the P+-type well 310 such that the forward characteristics of the freewheeling diode DF33 are optimized. The P+-type deep impurity region 370 may have an impurity concentration of $1 \times 10^{16}$ to $1 \times 10^{18}$ cm$^{-3}$. A plurality of P+-type deep impurity regions 370 are formed in a stripe pattern along the high voltage transistor Q33.

Figure 7A:
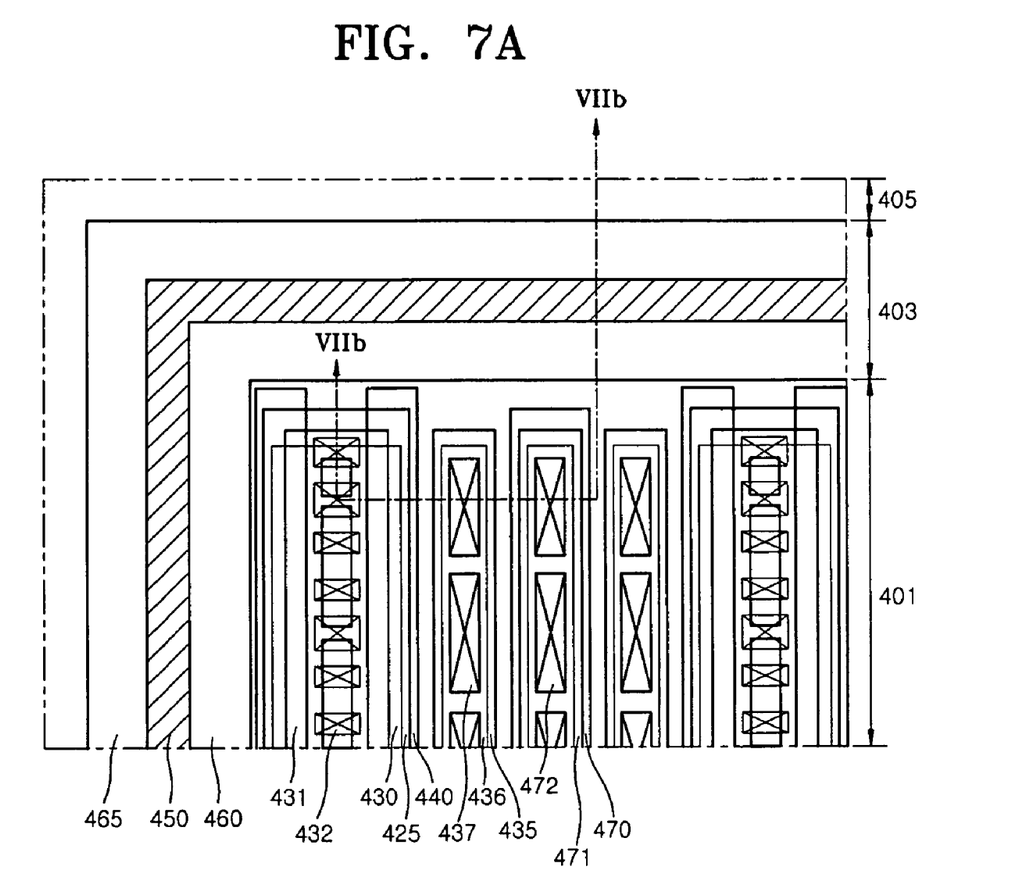
FIG. 7A is a plan view of a high voltage integrated circuit according to an embodiment.
Figure 7B:
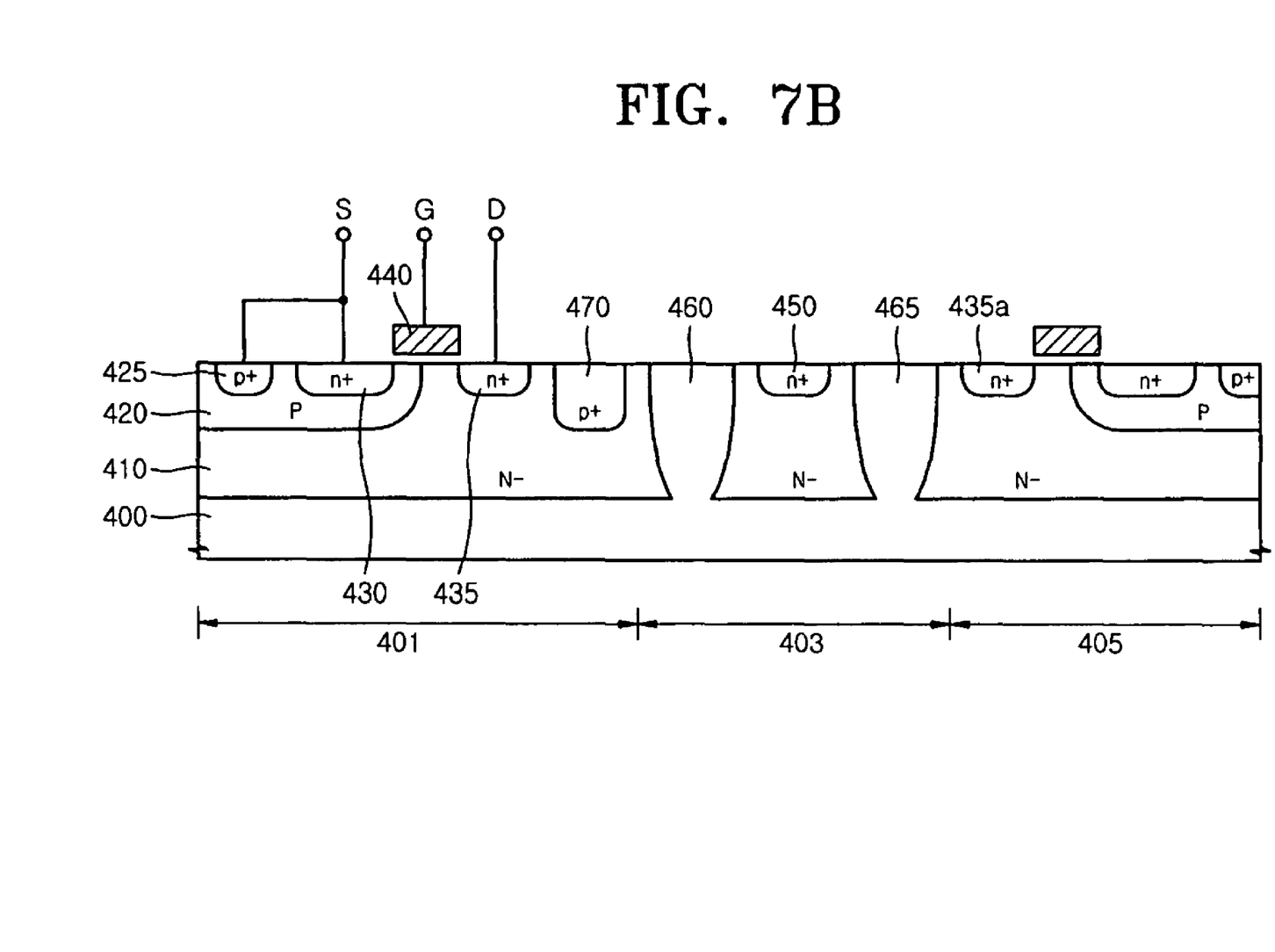
FIG. 7B is a sectional view taken along a line VIIb-VIIb of FIG. 7A.

FIG. 7A illustrates a plan view of a high voltage integrated circuit according to some embodiment, and FIG. 7B is a sectional view taken along a line VIIb-VIIb of FIG. 7A. An equivalent circuit diagram of the high voltage integrated circuit of FIGS. 7A and 7B that is applied to a motor driver circuit is identical to that of FIG. 6C. In this embodiment, N-type DMOS transistors Q31, Q32, Q33 and Q34 are used for driving a motor M. FIGS. 7A and 7B particularly illustrate a transistor Q33 and a freewheeling diode DF33 as also illustrated in FIG. 6C. In FIG. 7A, a source P+-type 431 and a drain P+-type 436 electrically connected respectively to an N+-type source region 430 and an N+-type drain region 435, contacts 432 and 437 electrically connecting the N+-type source and drain regions 430 and 435 to the source and drain wires 431 and 436, a P+-type 471 electrically connected to a P+-type deep impurity region 470, and a contact 472 electrically connecting the P+-type deep impurity region 470 to the P+-type 471 are omitted for conciseness.

Referring to FIGS. 7A and 7B, a power block 401 is surrounded by a device isolation region 403 and is thus isolated from a control block 405. The power block 401 includes a high voltage transistor Q33 and a freewheeling diode DF33 embedded in the high voltage transistor Q33. A N--type well 410 is formed on a P-type semiconductor substrate 400, and a P-type body region 420 is formed in the N--type well 410. The N+-type source region 430 and a P+-type junction region 425 are formed in the P-type body region 420, and the N+-type drain region 435 is formed in the N--type well 410.

A gate insulation layer (not illustrated) is formed on the P-type semiconductor substrate 400 between the N+-type source region 430 and the N+-type drain region 435, and a gate (G) 440 is formed on the gate insulation layer. The N+-type source region 430 and the P+-type junction region 425 are commonly connected through the contact 432 to the source wire (S) 431. The N+-type drain region 435 is electrically connected through the contact 437 to the drain wire (D) 436.

In the power block 401, the P+-type deep impurity region 470 is formed in the N--type well 410 neighboring the N+-type drain region 435. The P+-type deep impurity region 470 has a greater junction depth than the N+-type source and drain regions 430 and 435, and in particular the N+-type drain region 435. The P+-type deep impurity region 470 forms a PN junction with the N+-type drain region 435 to form the freewheeling diode DF33. The P+-type impurity region 470 and the N+-type drain region 435 operate as an anode and a cathode, respectively. The N+-type drain region 435 forms a PN junction with the P-type semiconductor substrate 400 to form a parasitic freewheeling diode DP33. The P+-type deep impurity region 470 is electrically connected through the contact 472 to the wire 471.

In the device isolation region 403, an N+-type guard ring 450 is formed in the N--type well 410 to surround the power block 401. The N+-type guard ring 450 is formed simultaneously with the N+-type source and drain regions 430 and 435 of the transistor Q33. P-type impurity regions 460 and 465 are formed on both sides of the N+-type guard ring 450 to isolate the power block 401 from the control block 405.

Like the conventional art, a parasitic NPN transistor is formed of an N+-type impurity region 435a of the control block 405, the P-type impurity region 465 of the device isolation layer 403, and the N+-type drain region 435 of the NMOS transistor Q33. Another parasitic NPN transistor is formed of the N+-type impurity region 435a of the control block 405, the P-type impurity region 460 of the device isolation region 403, and the N+-type drain region 435 of the NMOS transistor Q33. Another parasitic NPN transistor is formed of the guard ring 450, the P-type impurity region 460, and the N+-type drain region 435 of the NMOS transistor Q33.

In a freewheeling operation mode, the parasitic diodes DP32 and DP33 are turned on, and thus the output node of the motor M is maintained at a low voltage with respect to a ground voltage. At this time, although the parasitic NPN transistors are formed, since the freewheeling diode DF33 embedded in the high voltage transistor Q33 of the power block 401 is turned on to operate as a current sink source, a current sink occurring from the control block 405 is prevented in the freewheeling operation mode. Also, since a current sink from the control block 405 is prevented by the formation of the freewheeling diode DF33, a distance between the control block 405 and the guard ring 450 can be reduced. The distance between the control block 405 and the guard ring 450 may be maintained at about 100 μm.

It has been described that the anode of the freewheeling diode DF33 has a single junction structure of the P+-type deep impurity region 470. However, the anode of the freewheeling diode DF33 may have a double junction structure by forming a P+-type impurity region on the P-type deep impurity region as in the embodiment illustrated in FIGS. 5A through 5C. In this case, the junction depth or impurity concentration of the P+-type deep impurity region 470 is determined by the junction depth of the N+-type drain region 435, the junction depth of the well 410, or the concentration of the P-type body region 420 such that the forward characteristics of the freewheeling diode DF33 are optimized. The P+-type deep impurity region 470 may have an impurity concentration of $1 \times 10^{16}$ to $1 \times 10^{18}$ cm$^{-3}$. A plurality of P+-type deep impurity regions 470 are formed in a stripe pattern along the high voltage transistor Q33.

It has been described that NPN or NMOS high voltage transistors are used to form the high voltage integrated circuit of various embodiments. However, PNP transistors, PMOS transistors, or Bi-CMOS transistors may also be used as the high voltage transistors forming the high voltage integrated circuit.

As described above, in the high voltage integrated circuit, a freewheeling diode for a current sink is embedded in a high voltage transistor of a power block and operates as a current sink source. Therefore, a current sink from a control block can be prevented. Accordingly, signal distortion and noise can be prevented from occurring and thus the malfunction of the control block can be prevented.

Also, since a distance between the control block and a guard ring can be minimized by formation of the current sink type freewheeling diode, the chip size can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A high voltage integrated circuit comprising:
   a control block; and
   a power block configured to be isolated from the control block by a device isolation region and to comprise a high voltage transistor formed therein,
   the high voltage transistor comprising:
      a semiconductor substrate;
      a well of a first conductivity type formed in the semiconductor substrate;
      source and drain regions of a second conductivity type directly formed in the well to be spaced apart from each other; and
      a gate formed on the semiconductor substrate between the source and drain regions;
   wherein the power block further comprises a deep impurity region of the first conductivity type separated from the source and drain regions and disposed near to one of the source and drain regions in the well to form a PN junction with the one of the source and drain regions and is commonly electrically connected to the other one of the source and drain regions.

2. The high voltage integrated circuit of claim 1, wherein the deep impurity region has a double junction structure of a shallow junction region and a deep junction region, the shallow junction region having a predetermined junction depth, the deep junction region having a greater junction depth than said one of the source and drain regions.

3. The high voltage integrated circuit of claim 1, wherein the deep impurity region has a single junction structure having a greater junction depth than said one of the source and drain regions.

4. The high voltage integrated circuit of claim 1, further comprising a guard ring of the second conductivity type arranged in the device isolation region, the guard ring having the same junction depth as said one of the source and drain regions.

5. The high voltage integrated circuit of claim 4, wherein a distance between the guard ring and the control block is about 100 μm.

6. A high voltage integrated circuit comprising:
   a control block controlling a high voltage transistor; and
   a power block configured to be isolated from the control block by a device isolation region and to comprise the high voltage transistor formed therein,
   the high voltage transistor comprising:
      a semiconductor substrate of a first conductivity type;
      a well of a second conductivity type formed in the semiconductor substrate;
      source and drain regions of the second conductivity type formed in the well to be spaced apart from each other, at least one of the source and drain regions formed directly in the well;
      a body region of the first conductivity type completely surrounding one of the source and drain regions; and
      a gate formed on the semiconductor substrate between the source and drain regions, configured to be partially overlapped with the body region;
   wherein the power block further comprises a deep impurity region of the first conductivity type separated from the source and drain regions and disposed near to the other one of the source and drain regions in the well to form a PN junction with the other one of the source and drain regions and is commonly electrically connected to the other one of the source and drain regions.

7. The high voltage integrated circuit of claim 6, wherein the deep impurity region has a double junction structure of a shallow junction region and a deep junction region, the shallow junction region having a predetermined junction depth, the deep junction region having a greater junction depth than the other one of the source and drain regions.

8. The high voltage integrated circuit of claim 6, wherein the deep impurity region has a single junction structure having a greater junction depth than the other one of the source and drain regions.

9. The high voltage integrated circuit of claim 6, further comprising a guard ring of the second conductivity type arranged in the device isolation region, the guard ring having the same junction depth as the one of the source and drain regions.

10. The high voltage integrated circuit of claim 9, wherein a distance between the guard ring and the control block is about 100 μm.

* * * * *